(12) United States Patent
Guillot et al.

(10) Patent No.: US 11,350,530 B2
(45) Date of Patent: May 31, 2022

(54) METHOD FOR PRODUCING A BACKPLANE CIRCUIT BOARD

(71) Applicant: SAFRAN ELECTRONICS & DEFENSE, Boulogne-Billancourt (FR)

(72) Inventors: François Guillot, Moissy-Cramayel (FR); Patrice Chetanneau, Moissy-Cramayel (FR)

(73) Assignee: SAFRAN ELECTRONICS & DEFENSE, Boulogne-Billancourt (FR)

( * ) Notice: Subject to any disclaimer, the term of this patent is extended or adjusted under 35 U.S.C. 154(b) by 0 days.

(21) Appl. No.: 17/416,093

(22) PCT Filed: Dec. 19, 2019

(86) PCT No.: PCT/FR2019/053193
§ 371 (c)(1),
(2) Date: Jun. 18, 2021

(87) PCT Pub. No.: WO2020/128355
PCT Pub. Date: Jun. 25, 2020

(65) Prior Publication Data
US 2022/0046807 A1 Feb. 10, 2022

(30) Foreign Application Priority Data

Dec. 21, 2018 (FR) ........................ 1873975

(51) Int. Cl.
*H05K 3/46* (2006.01)
*H05K 3/40* (2006.01)
(52) U.S. Cl.
CPC ......... *H05K 3/4623* (2013.01); *H05K 3/4007* (2013.01)

(58) Field of Classification Search
CPC .. H05K 3/4623; H05K 3/4641; H05K 3/4007; Y10T 29/49126; Y10T 29/4928; Y10T 29/49155; Y10T 29/49165
(Continued)

(56) References Cited

U.S. PATENT DOCUMENTS 4,788,766 A * 12/1988 Burger ................. H05K 3/462
29/830
5,601,672 A  2/1997 Casey et al.
(Continued)

FOREIGN PATENT DOCUMENTS

WO  WO 2016/151053 A1  9/2016

OTHER PUBLICATIONS

French Preliminary Search Report issued in Priority Application No. FR 1873975.
(Continued)

*Primary Examiner* — Donghai D Nguyen
(74) *Attorney, Agent, or Firm* — Birch, Stewart, Kolasch & Birch, LLP

(57) ABSTRACT

A process for producing a backplane circuit board (20) having an internal face (142) adapted to be connected to connectors (13) of circuit boards (12) and an external face (143) adapted to be connected to an external connector (15), blind holes (146, 148) opening on the internal face (142) and external face (143) of the backplane circuit board (20), wherein bonding layers (31, 32) having zones (41, 42) cleared of material facing the blind holes are used between the printed circuits (21, 22, 23).

12 Claims, 5 Drawing Sheets

E1

(58) Field of Classification Search
USPC .................................. 29/830, 831, 846, 852
See application file for complete search history.

(56) References Cited

U.S. PATENT DOCUMENTS

| | | | |
|---|---|---|---|
| 6,090,633 | A | 7/2000 | Yu et al. |
| 6,407,341 | B1 * | 6/2002 | Anstrom ............. H05K 3/4641 |
| | | | 29/852 |
| 10,375,849 | B2 | 8/2019 | Guillot et al. |
| 2005/0109532 | A1 | 5/2005 | Hermkens et al. |
| 2012/0160547 | A1 | 6/2012 | Antesberger et al. |
| 2014/0353018 | A1 | 12/2014 | Soeda et al. |

OTHER PUBLICATIONS

International Search Report dated Apr. 2, 2020 in related International Application No. PCT/FR2019/053193.

* cited by examiner

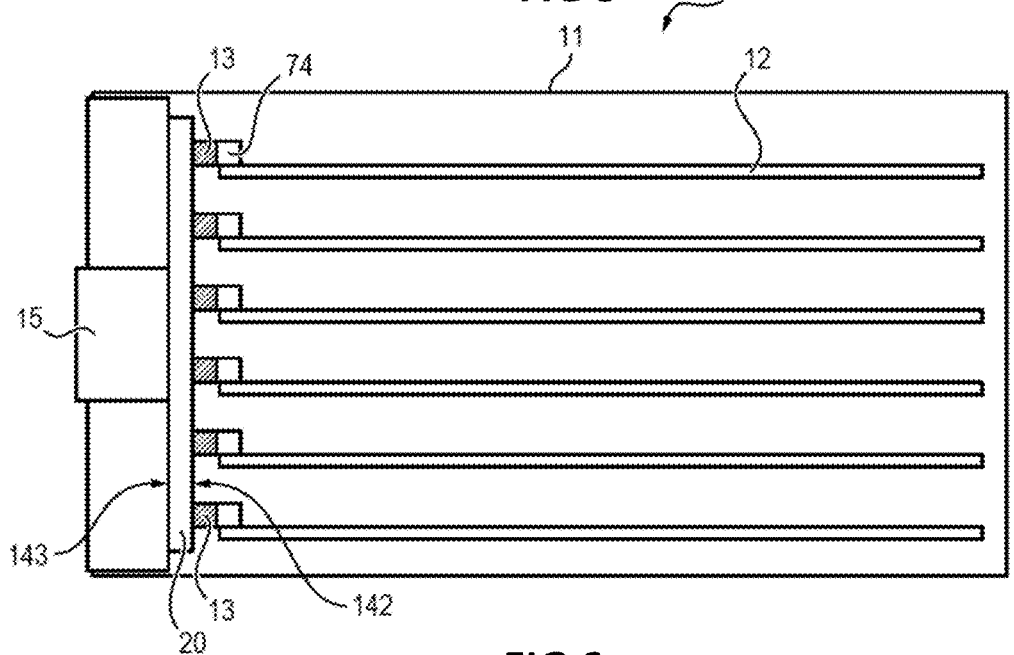
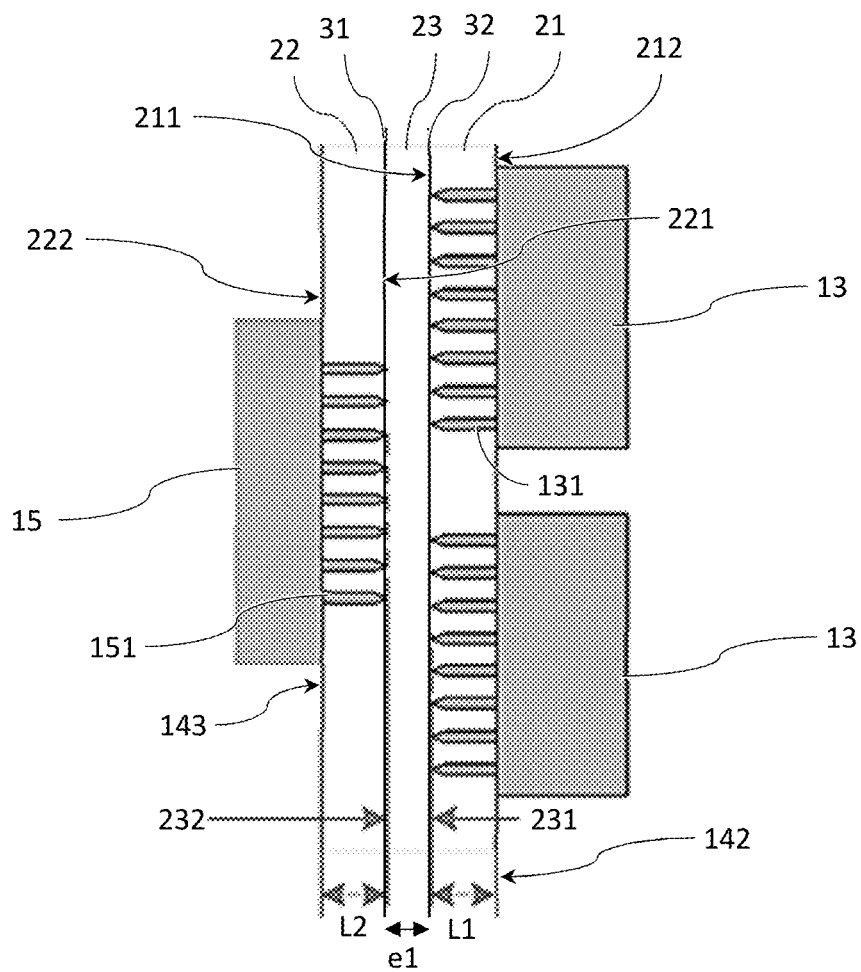

FIG 8
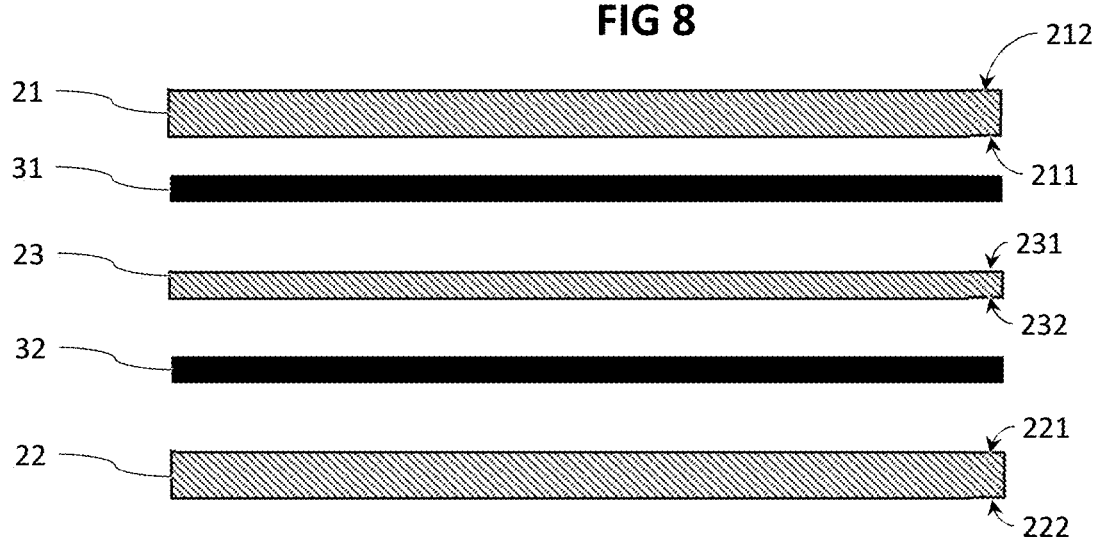
E1
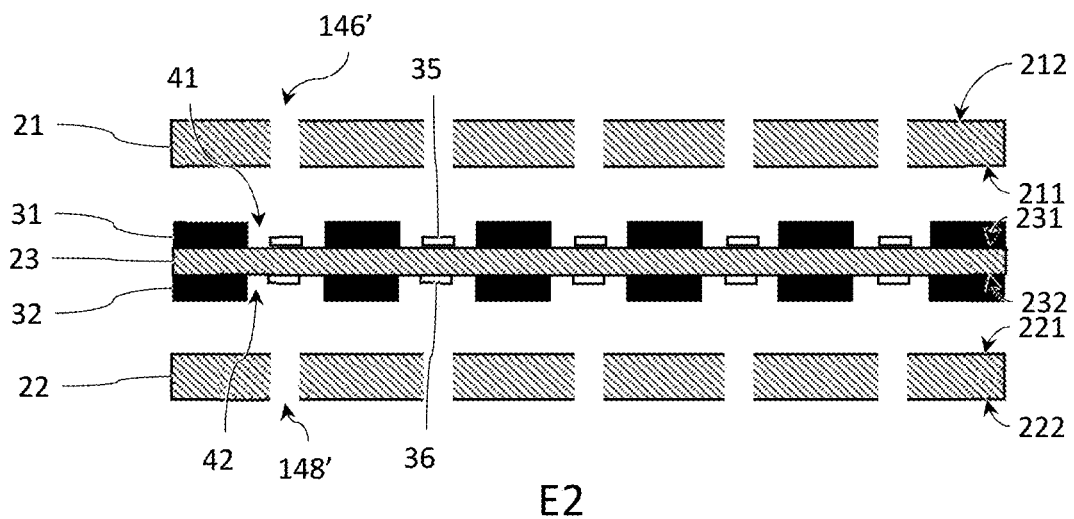
E2
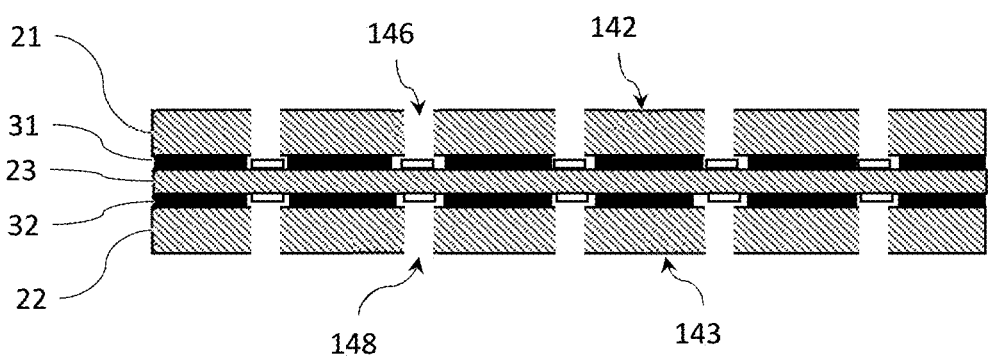
E3

METHOD FOR PRODUCING A BACKPLANE CIRCUIT BOARD

TECHNICAL FIELD

The field of the invention is that of electronic computers and in particular computers of on-board avionics systems. More precisely, the invention refers to the process for producing a backplane circuit board for a computer of on-board avionics systems.

PRIOR ART

In modern aircraft, it is known to connect steering modules and/or control modules of functional members of the aircraft together via one or more main buses of the aircraft. These buses are currently buses specific to the field of the aviation, and especially buses using the distributed serial bus protocols of ARINC 429 type or other. So, by way of example, for managing the mobile elements of the landing gear of an aircraft, several steering modules and/or control modules are implemented, the latter each being connected to the main buses of the aircraft.

Each control module comprises a computer running a program adapted to ensure the control function to which it is dedicated, as well as a communications interface adapted to the protocol of the main bus allowing data exchange between the computer and the main buses of the aircraft.

Figure 1:
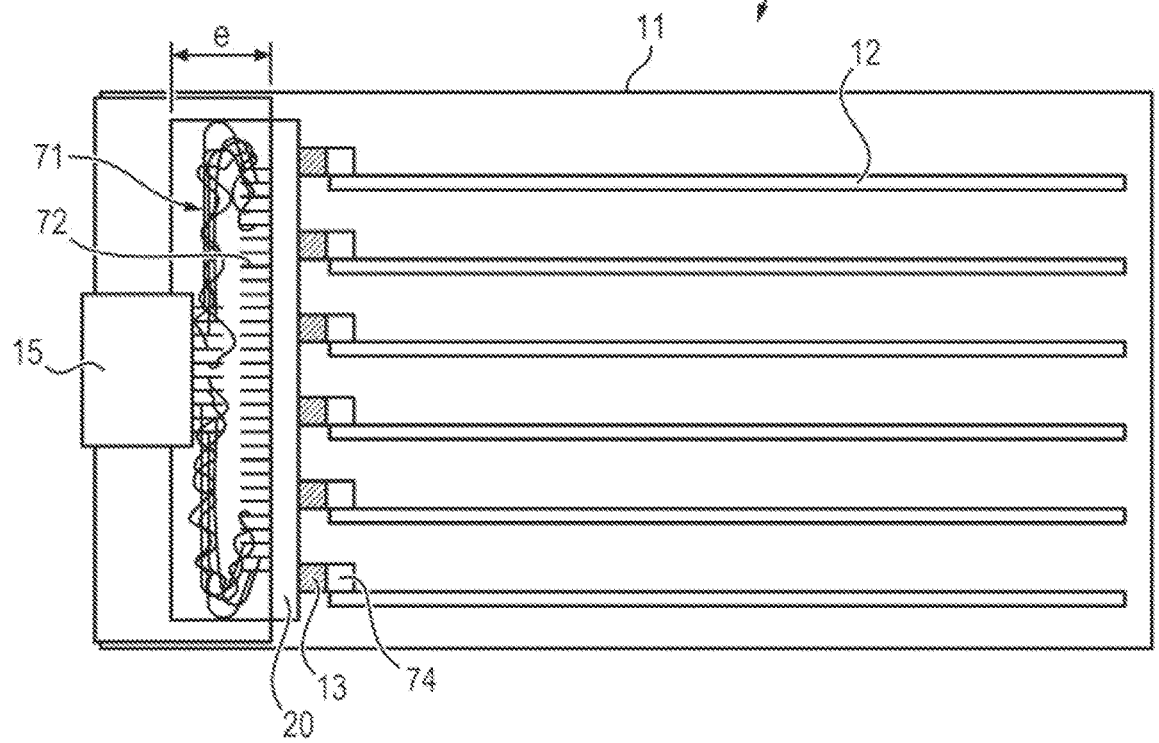

FIG. 1 shows the simplified diagram of an electronic computer 1, comprising a mechanical frame 11, one or more circuit boards 12 and a board 20 known as backplane board.

Each circuit board 12 is held mechanically in the frame 11 by slide rails and connected to the backplane circuit board 20. The backplane circuit board 20 comprises board connectors 13 adapted to be connected to a complementary connector 74 borne by the circuit board 12.

For each control module the backplane circuit board 20 comprises an external connector 15 adapted to cooperate with a complementary connector borne by the associated module.

As illustrated in FIG. 1, it is known to connect the external connector 15 to the backplane circuit board 20 by wires 71 wound onto square spindles 72 of the components, according to the method known as 'Wrapping'.

The technique of wrapping has many drawbacks and especially an excessive cost price, obsolescence of components and skills and mediocre electromagnetic compatibility performance.

Another disadvantage of wrapping is that the absence of impedance adaptation and noise can generate reflection phenomena at high frequencies and electronics failures on critical signals.

Another disadvantage of wrapping is that it needs a cabling zone of consistent width which goes against the compactness of the computer 1.

Figure 2:
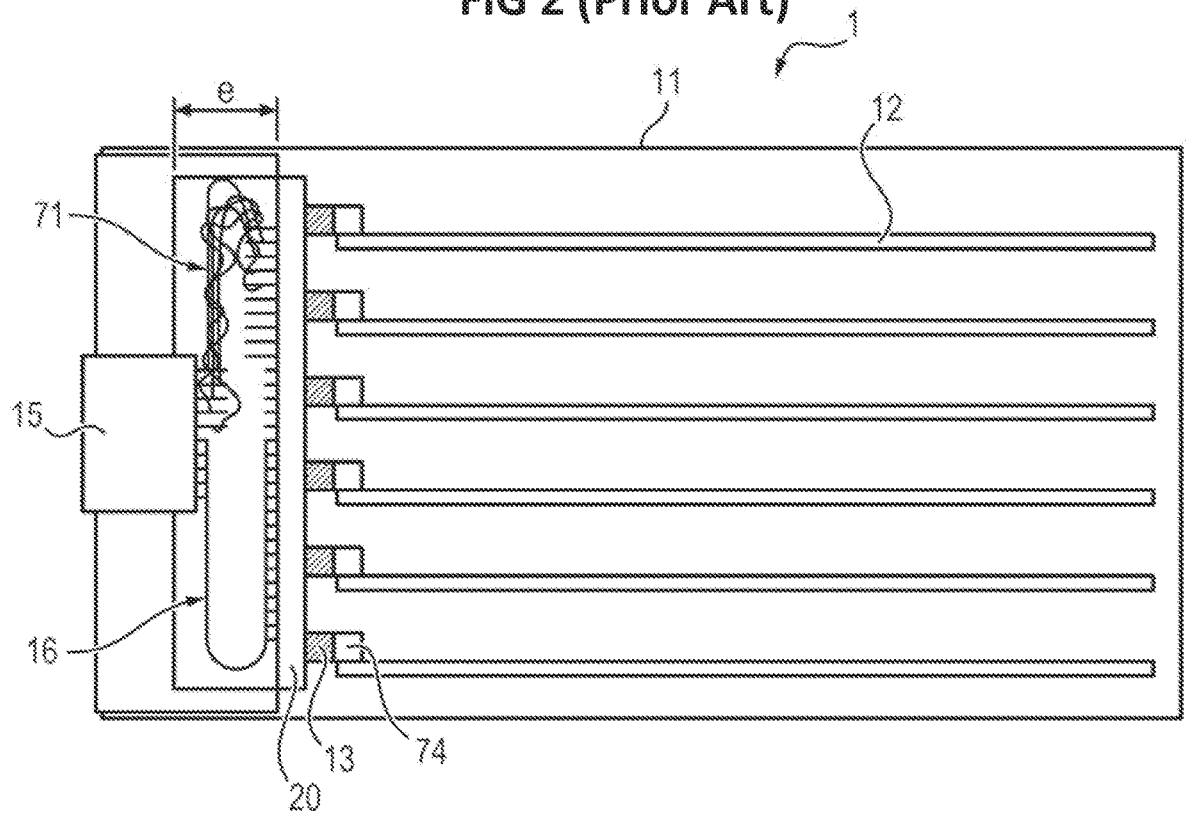

As illustrated in FIG. 2, it has been proposed to use a sheet 16 which is a flat electrical strip (flexible sheet printed circuit), constituted by copper wires stuck to each other, fitted with a connector at each of its ends to connect the external connector 15 and the backplane circuit board 20.

Figure 3:
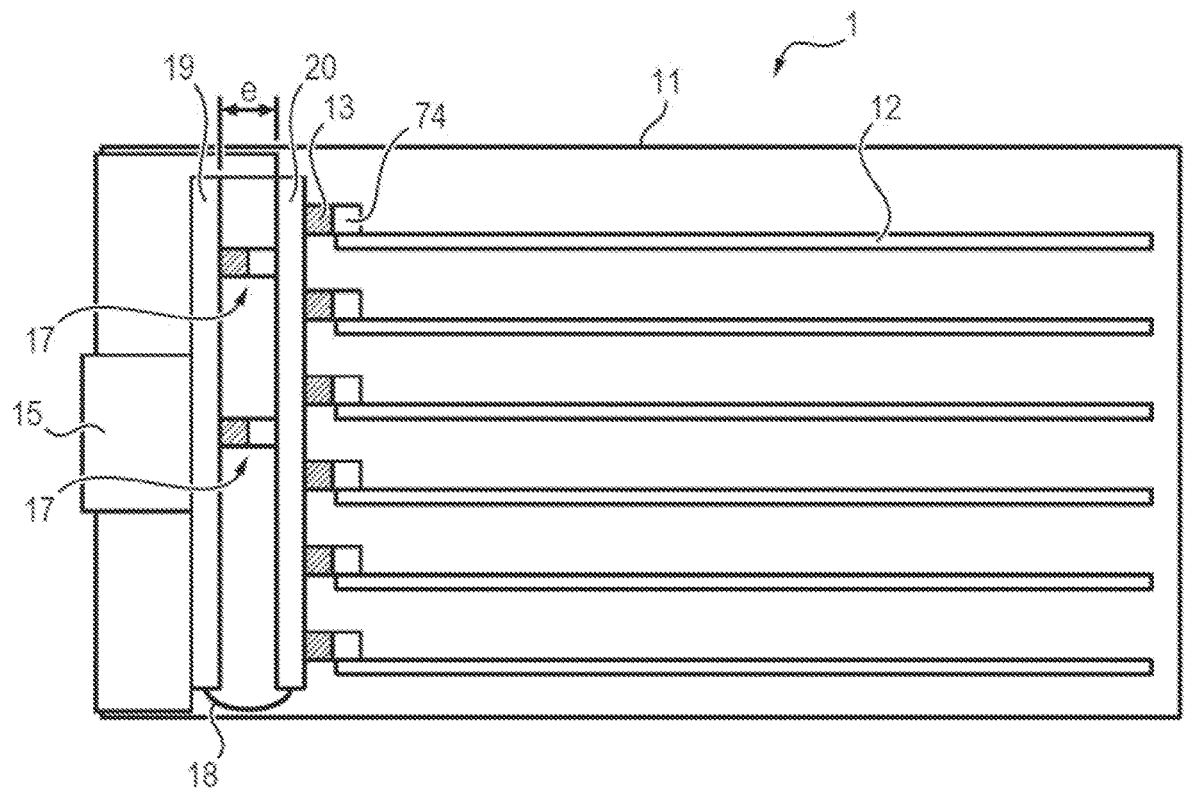

As illustrated in FIG. 3, it has also been proposed to connect the external connector 15 to a printed connecting circuit 19 connected to the backplane circuit board 20 by means of a flexible printed circuit 18 and complementary connectors of interconnections 17.

All these solutions are complex, costly and bulky.

Circuit boards, such as that described in document US 2005/109532 (D1), are also known, comprising two printed circuits stuck to each other by a layer of resin and having a series of first blind holes opening on the first face of the circuit board and a series of second blind holes opening on the second face of the circuit board for direct reception of connectors using a technology of spindles force-mounted in metallised holes and being mounted directly on either side of each PCB face.

In such circuit boards the resin risks rising in the blind holes during assembling of the printed circuits, the consequence of which is that the connection elements in the form of a spindle can no longer be inserted into the blind holes. Even when the connection elements in the form of a spindle can be inserted into the blind holes, there is the risk of a defect in electrical contact due to the presence of the resin.

Figure 4:
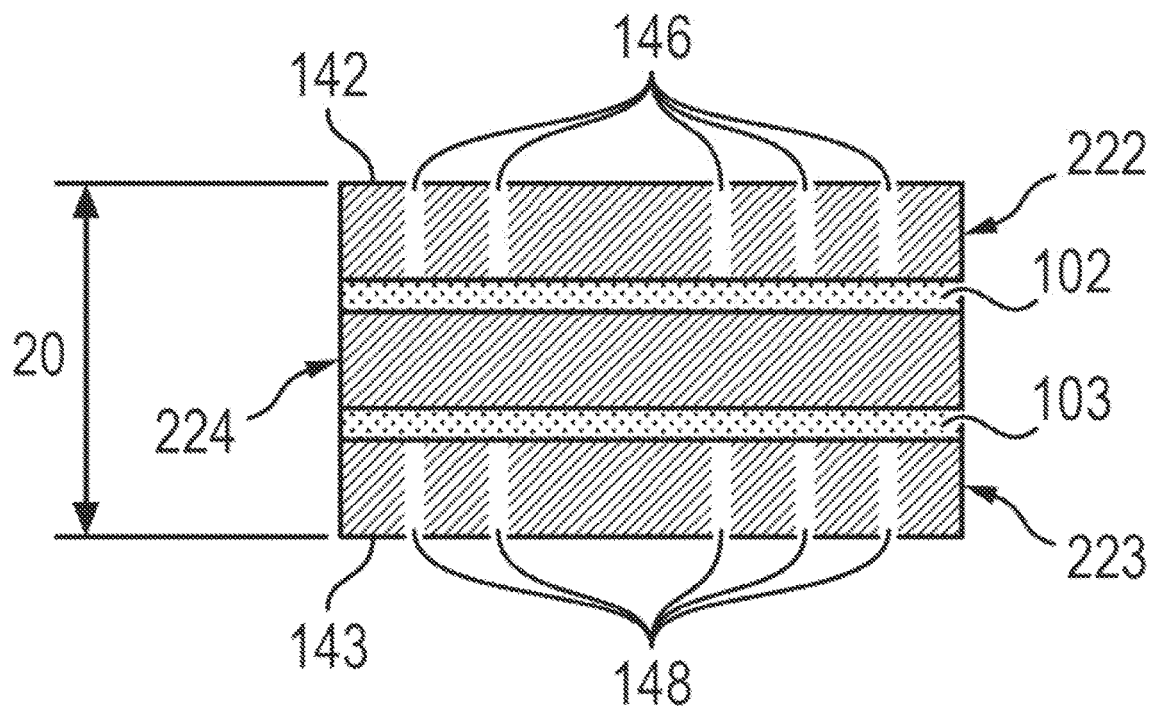

In reference to FIG. 4, patent application WO2016151053 describes a backplane circuit board 20 having an internal face 142 adapted to be connected to connectors of circuit boards and an external face 143 adapted to be connected to an external connector. The backplane circuit board 20 comprises a first printed circuit 222 having a face designed to form the internal face 142 of the backplane circuit board 20, a second printed circuit 223 having a face designed to form the external face 143 of the backplane circuit board 20 and a third printed circuit 224 between the first printed circuit 222 and the second printed circuit 223.

The backplane circuit board 20 comprises a first airtight membrane 102, and the first printed circuit 222 has a series of first blind holes 146 opening on the one hand on the internal face 142 of the backplane circuit board 20 and on the other hand on the first airtight membrane 102.

The backplane circuit board 20 comprises a second airtight membrane 103, and the second printed circuit 223 has a series of second blind holes 148 opening on the one hand on the external face 143 of the backplane circuit board 20 and on the other hand on the second airtight membrane 103.

The first and the second blind holes 146, 148 are adapted to receive connection elements by forced insertion and together form a point of electrical connection. The first airtight membrane 102 is placed between the first printed circuit 222 and the third printed circuit 224, and the second airtight membrane 103 is placed between the second printed circuit 223 and the third printed circuit 224. The first and second airtight membranes prevent rising of the resin used in the adhesive material in the blind holes 146, 148 during production of the backplane circuit board 20.

Yet the presence of these airtight membranes causes added restrictions on dimensioning. Such a backplane circuit board must in fact present minimal thickness, for example between 3.5 and 6 mm, whereas the connection elements in the form of a spindle typically present a length between 1.7 mm and 2 mm. Therefore, the presence of these airtight membranes leads to providing lean dimensions in thickness of the elements of the backplane circuit board. Any deviation can result in blind holes not deep enough to correctly take up the connection elements in the form of a spindle. On the other hand, the production process described by application WO2016151053 provides the formation of blind holes in the first printed circuit and the second printed circuit after assembling of the three printed circuits, involving strict control of bore holes. These restrictions complicate production and increase costs and issues of non-conformity.

Presentation of the Invention

The aim of the invention is simple and easy production of such a backplane circuit board, which avoids rising of the resin of the adhesive material in the blind holes, and therefore creates blind holes present at a maximal useful depth for the connection spindles designed to be taken up in these blind holes.

For this purpose, the invention proposes a process for producing a backplane circuit board having an internal face adapted to be connected to circuit board connectors and an external face adapted to be connected to an external connector, a series of first blind holes opening on the one hand on the internal face of the backplane circuit board and a series of second blind holes opening on the one hand on the external face of the backplane circuit board, the backplane circuit board comprising:

a first printed circuit having a first face and a second face designed to form the internal face of the backplane circuit board;

a second printed circuit having a first face and a second face designed to form the external face of the backplane circuit board and;

a third printed circuit having a first face facing the first face of the first printed circuit and a second face facing the first face of the second printed circuit, the third printed circuit constituting an electrical insulator between its first face and its second face, said first blind holes passing through the first printed circuit but not passing through the third printed circuit and said second blind holes passing through the second printed circuit but not passing through the third printed circuit, the process comprising the following steps:

depositing on the first face of the third printed circuit of a first bonding layer, said first bonding layer having first zones cleared of material distributed on the first face of the third printed circuit, and depositing on the second face of the third printed circuit of a second bonding layer, said second bonding layer having second zones cleared of material distributed on the second face of the third printed circuit;

assembling on the first bonding layer of the first face of the first printed circuit, said first printed circuit having a series of first through-holes designed to form the first blind holes, each first through-hole opening in a first zone cleared of material of the first bonding layer on the first face of the third printed circuit to form the first blind holes, and assembling on the second bonding layer of the first face of the second printed circuit, said second printed circuit having a series of second through-holes designed to form the blind holes, each second through-hole opening in a second zone cleared of material to form the second blind holes of the second bonding layer on the second face of the third printed circuit to form the second blind holes.

To form the blind holes, the zones cleared of material of the bonding layers opposite each hole of the printed circuits prevent rising of the adhesive material such as resin in these blind holes, by absorbing the creep of this resin during assembling, which at least partially fills these zones cleared of material.

Typically, the adhesive material comprises a fabric impregnated with non-polymerised resin. The resin of the adhesive material preferably has a dynamic viscosity greater than 5000 poises between 80° C. and 180° C., and preferably greater than 10000 poises below 100° C. The use of such adhesive material limits creep of the adhesive material in the zones cleared of material of the bonding layers, and therefore further limits the risk of rising of the adhesive material such as resin in the blind holes. Also, the low creep of the material constituting the bonding layers manipulates these bonding layers prior to the deposition on the third printed circuit, and especially pierces the zones cleared of material prior to the deposition.

The zones cleared of material which face the through-holes of the printed circuits designed to form the blind holes preferably present a diameter greater than the diameters of these through-holes by at least 100 µm, and preferably at least 250 µm, and more preferably by at least 500 µm. The creep of the material of the bonding layer during assembling fills these zones cleared of material at least partially. Due to the greater diameter of the zones cleared of material, these zones cleared of material present a greater volumetric capacity of absorption, which therefore better absorbs the creep of the resin and therefore prevents rising of the resin in the blind holes. Also, the resin is initially further away from the through-holes of the printed circuits designed to form the blind holes, further limiting this risk.

Preferably, the third printed circuit comprises conductive pads distributed on its faces, such that these conductive pads are in zones cleared of material of the bonding layers after deposition of the latter, opposite the through-holes of the printed circuits designed to form the blind holes. The conductive pads form an obstacle to displacement of the resin during assembling in the direction of the through-holes of the printed circuits designed to form the blind holes, and therefore prevent the resin from rising in these blind holes. More preferably, the conductive pads present central recesses facing the through-holes of the printed circuits designed to form the blind holes. The central recesses extend the through-holes of the printed circuits designed to form the blind holes and constitute the base of the blind holes. The central recesses increase the depth of the blind holes despite the presence of the conductive pads.

The process is therefore advantageously completed by the following characteristics, taken singly or in any of their technically possible combinations:

a first through-hole has a diameter, and a first zone cleared of material in which said first through-hole opens has a diameter greater than the diameter of the first through-hole of at least 100 µm, and wherein a second through-hole has a diameter, and a second zone cleared of material in which said second through-hole opens has a diameter greater than the diameter of the second through-hole of at least 100 µm;

the adhesive material comprises a fabric impregnated with non-polymerised resin, and the resin preferably has a dynamic viscosity greater than 5000 poises between 80° C. and 180° C.;

the first bonding layer has the first zones cleared of material before its deposition on the first face of the third printed circuit and/or the second bonding layer has the second zones cleared of material before its deposition on the second face of the third printed circuit;

the third printed circuit comprises first conductive pads distributed on the first face, the first bonding layer being arranged on the first face of the third printed circuit such that the first conductive pads are in first zones cleared of material of the first bonding layer, after assembling said first conductive pads face first through-holes of the first printed circuit to form the base of the first blind holes of the internal face of the backplane circuit board; and/or the third printed circuit comprises second conductive pads distributed on the second face, the second bonding layer being arranged on the second face of the third printed circuit such that the second conductive pads are in second zones cleared of material of the second bonding layer, and after assembling the second conductive pads face second through-holes of the second printed circuit to form the base of the second blind holes of the external face of the backplane circuit board;

the conductive pads present a central recess opposite the through-holes of the first printed circuit and/or of the second printed circuit designed to form the blind holes;

the conductive pads result from previous etching of a conductive layer of the third printed circuit;

first through-holes and/or second through-holes designed to form the blind holes present a metallic coating on their walls having a first flange extending on the first faces of the first and second printed circuits;

assembling on the first bonding layer of the first face of the first printed circuit comprises placing of the first face of the first printed circuit on the first bonding layer with the first through-holes designed to form the blind holes facing first zones cleared of material, and pressing of the first printed circuit on the first bonding layer with heating at a temperature between 140 and 200° C., and/or assembling on the second bonding layer of the first face of the second printed circuit comprises placing of the first face of the second printed circuit on the second bonding layer with the second through-holes designed to form the blind holes facing second zones cleared of material, and pressing of the second printed circuit on the second bonding layer with heating at a temperature between 140 and 200° C.

PRESENTATION OF THE FIGURES

Figure 7:
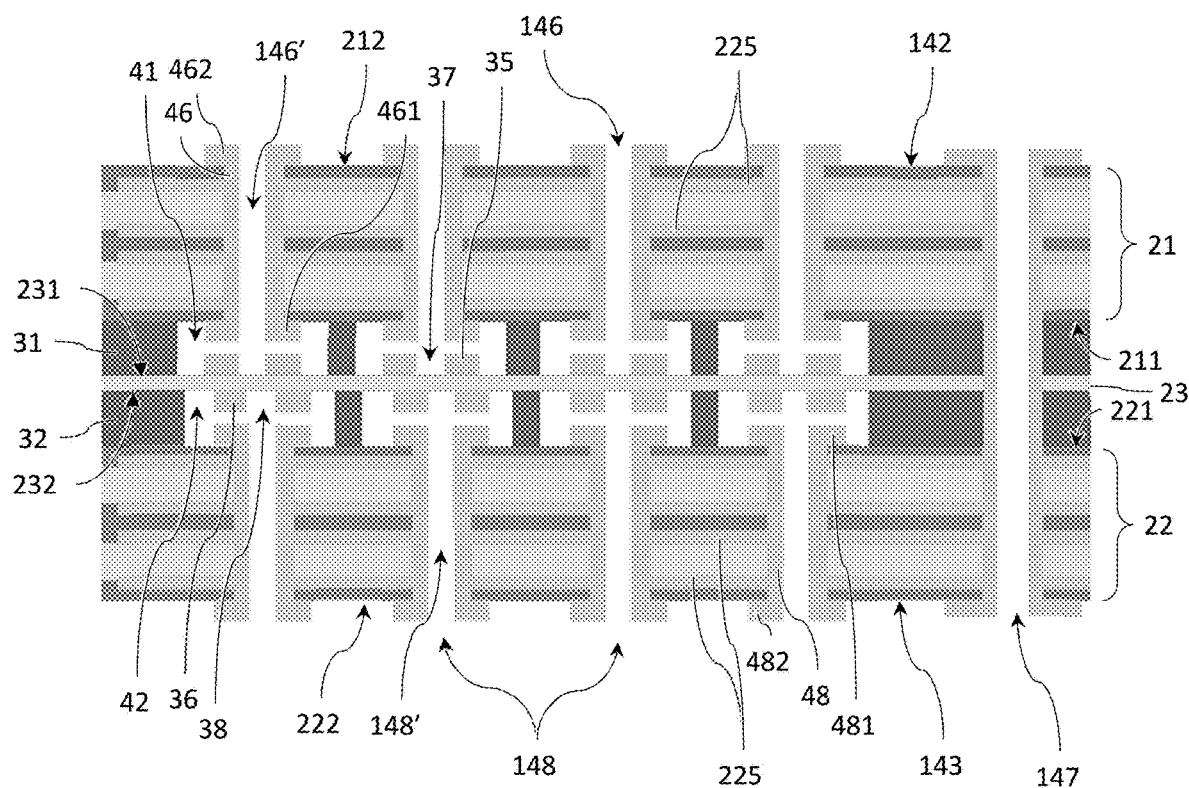

The invention will be better understood by way of the following description which relates to embodiments and variants according to the present invention given by way of non-limiting examples and explained with reference to the appended schematic drawings in which:

FIG. 1 schematically illustrates an example of electronic computer of the prior art;

FIG. 2 schematically illustrates an example of electronic computer of the prior art;

FIG. 3 schematically illustrates an example of electronic computer of the prior art;

FIG. 4 schematically illustrates a sectional view of a backplane circuit board of the prior art;

FIG. 5 schematically illustrates an example of electronic computer according to an embodiment of the invention;

FIG. 6 schematically illustrates an enlargement of the connections of a backplane circuit board according to an embodiment of the invention;

FIG. 7 schematically illustrates an enlargement of a sectional view showing the internal composition of a backplane circuit board according to an embodiment of the invention;

FIG. 8 schematically illustrates steps for production of a backplane circuit board according to an embodiment of the invention.

DETAILED DESCRIPTION

In reference to FIG. 5, an electronic computer 1 comprises a mechanical frame 11, one or more circuit boards 12 held mechanically in the frame 11 and a circuit board known as backplane board 20 which constitutes the base of the mechanical frame 11.

Mechanical Frame 11

In reference to FIG. 5, the mechanical frame 11 is typically a rectangular parallel piped comprising two open parallel faces: a first open face adapted for introducing the circuit boards 12 and a second open face adapted to be closed by the backplane circuit board 20. The circuit boards 12 are held mechanically in the frame 11 for example by slide rails. The backplane circuit board 20 is fixed by its periphery on the flanks of the mechanical frame 11. The computer can also comprise a backplane circuit board support fixed to the mechanical frame 11 on which the backplane circuit board 20 is fixed.

Backplane Circuit Board 20

The backplane circuit board 20 is adapted to be fixed to the mechanical frame 11 so as to close the second open face of the mechanical frame 11.

In reference to FIG. 6 and FIG. 7, the backplane circuit board 20 has an internal face 142 adapted to be connected to connectors 13 of circuit boards 12 and an external face 143 adapted to be connected to an external connector 15. The backplane circuit board 20 comprises:

a first printed circuit 21 having a first face 211 and a second face 212 designed to form the internal face 142 of the backplane circuit board 20;

a second printed circuit 22 having a first face 221 and a second face 222 designed to form the external face 143 of the backplane circuit board 20 and;

a third printed circuit 23 having a first face 231 facing the first face 211 of the first printed circuit 21 and a second face 232 facing the first face 221 of the second printed circuit 22.

The first printed circuit 21 and the second printed circuit 22 are multilayer circuits which comprise conductive tracks 215, 225 at different levels of their thickness for routing signals between the different points of connection and define a routing zone for routing the signals. To the extent where the first printed circuit 21 and the second printed circuit 22 must take up connection elements in the form of a spindle, they present a thickness L1, L2 greater than 2 to 5 mm. However, the third printed circuit 23 can present a lesser thickness e3 relative to the first printed circuit 21 and the second printed circuit 22, and for example at least 2 to 3 times less. For example, the third printed circuit 23 can be between 50 and 500 µm in thickness, or even fewer than 200 µm in thickness.

The printed circuits 21, 22, 23 can conventionally comprise glass fabrics covered in polymerised epoxy and conductive tracks. However, the third printed circuit 23 constitutes an electrical insulator between its first face 231 and its second face 232. The printed circuit 23 preferably has insulating material (such as glass fabric covered in polymerised epoxy) on a thickness of at least 150 µm, and preferably of at least 200 µm, in the direction between the first printed circuit 21 and the second printed circuit 22.

The backplane circuit board 20 also comprises a first bonding layer 31 between the first face 231 of the third printed circuit 23 and the first face 211 of the first printed circuit 21. The backplane circuit board 20 also comprises a second bonding layer between the second face of the third printed circuit 23 and the first face of the second printed circuit 22.

The third printed circuit 23 can comprise first conductive pads 35 distributed on the first face 231 of the third printed circuit 23, projecting from this first face 231, by 10 µm for example. The first conductive pads 35 face first through-holes 146' of the first printed circuit 21 to form the base of the first blind holes 146 of the internal face 142 of the backplane circuit board 20. Similarly, the third printed circuit 23 can comprise second conductive pads 36 distributed on the second face 232 of the third printed circuit 23, projecting from this second face 232, by 10 µm for example. The second conductive pads 36 face second through-holes 148' of the second printed circuit 22 to form the base of the second blind holes 148 of the external face 143 of the backplane circuit board 20. Typically, the conductive pads 35, 36 are made of copper. The conductive pads 35, 36 present a thickness of 20 µm to 40 µm for example. The conductive pads 35, 36 are typically circular or annular in shape.

Preferably the conductive pads 35, 36 present central recesses 37, 38 facing the through-holes 146', 148" of the printed circuits 21, 22 designed to form the blind holes 146, 148. The central recesses 37, 38 extend the through-holes 146', 148" of the printed circuits 21, 22 designed to form the blind holes 146, 148 and constitute the base of the blind holes 146, 148. The central recesses 37, 38 increase the depth of the blind holes 146, 148 despite the presence of the conductive pads 35, 36. The central recesses 37, 38 can be made by piercing the conductive pads 35, 36, or can be made during a step for etching of the third printed circuit 23 to form the conductive pads 35, 36. The central recesses 37, 38 can extend over the entire depth of the conductive pads 35, 36, as illustrated in FIG. 7, or else extend over only some of the depth of the conductive pads 35, 36. For example, the central recesses 37, 38 extend over a depth of 17 to 35 µm.

Electronic Board 12

Each circuit board 12 comprises a printed circuit and electronic components. Each circuit board 12 is connected by means of one or more board connectors 13 on the internal face 142 of the backplane circuit board 20. The board connectors 13 present connection elements by forced insertion 131 (FIG. 6) which are typically connection elements in the form of a spindle. These connection elements in the form of a spindle typically have a length 12 between 1 and 2.5 mm.

External Connector of ARINC 600 15 Type

One or more control modules is connected to the backplane circuit board 20 so as to communicate with the bus of the latter according to a distributed serial bus protocol for example of ARINC 429 type. Each control module is constituted by one or more boards adapted to be connected to the external face 143 of the backplane circuit board 20 by an external connector 15, for example a connector of ARINC 600 type. The external connector 15 comprises a grip including connector indentations having connection elements by forced insertion 151 (FIG. 6) which are typically connection elements in the form of a spindle. These connection elements in the form of a spindle 151 typically have a length 11 of between 1 and 2.5 mm.

Blind Holes

In reference to FIG. 7, the backplane circuit board 20 has first blind holes 146 opening on its internal face 142 and adapted to receive connection elements by forced insertion borne by the board connectors 13, and second blind holes 148 opening on its external face 143 and adapted to receive connection elements by forced insertion borne by the external connectors 15. The blind holes 146, 148 do not pass through the backplane circuit board 20 on either side. More precisely, the first blind holes 146 pass through the first printed circuit 21, but pass through neither the third printed circuit 23 nor the second printed circuit 22. Similarly, the second blind holes 148 pass through the second printed circuit 22, but pass through neither the third printed circuit 23 nor the first printed circuit 21. The blind holes 146, 148 are coaxial and perpendicular to the plane of the backplane circuit board 20.

The blind holes 146, 148 are mainly constituted by through-holes 146', 148' made in the first and the second printed circuit 21, 22. The third printed circuit 23 closes the blind holes 146, 148, and, via the electrical insulation it produces, guarantees dielectric resistance between the first and the second printed circuit 21, 22, even in the region of the blind holes 146, 148.

The through-holes 146', 148' are metallised and therefore present metallic coatings 46, 48 on their walls. These metallic coatings 46, 48 set up an electrical link between the different conductive layers of the same multilayer printed circuit 21, 22. Metallisation of the holes consists of depositing a fine layer of copper inside the hole by a process for depositing copper by electrolysis. Once metallised, the hole makes the electrical connection between the layers it passes through. The metallic coatings 46, 48 of the walls of the through-holes 146', 148' preferably each present a first flange 461, 481 extending on the first faces 211, 221 of the printed circuits 21, 22. The metallic coatings 46, 48 of the walls of the through-holes 146', 148' can also each present a second flange 462, 482 extending on the second faces 212, 222 of the printed circuits 21, 22.

Metallised Through-Holes

The backplane circuit board 20 has through-holes 147 which pass through the backplane circuit board 20 on either side. More precisely, the through-holes 147 pass through the first printed circuit 21, the third printed circuit 23 and the second printed circuit 24. The through-holes 147 are metallised and set up an electrical connection between all the conductive layers 215, 225. The through-holes 147 are coaxial and perpendicular to the plane of the backplane circuit board 20. The metallic wall of the metallised through-hole 147 and the conductive layers connected to two equipotentials together form a low-pass filter network ensuring a filtering function for electromagnetic noise.

Connection Elements by Forced Insertion

The connection elements by forced insertion 131 borne by the board connectors 13 and the connection elements by forced insertion 151 borne by the external connector 15 are adapted to be inserted by force into one of the blind holes 146, 148 of the backplane circuit board 20 so as to form an electrical junction by forced insertion called 'press-fit', ensuring mechanical and electrical interconnection. Once the connection element by forced insertion 131 or 151 is inserted into a blind hole 146, 148, together they constitute a connection point.

When a contact element in the form of a spindles 131 and 151 is pushed into a blind hole 146 or 148, the contact element in the form of a spindle 131 and 151 and/or the blind holes 146, 148 deform elastically during insertion so as to create friction force between the two. To this effect, the contact elements in the form of a spindle 131, 151 present compression elasticity properties. The spindles comprise a pressure adjustment part adapted to be put in contact with an internal surface of the blind holes 146, 148 of the printed circuit. The pressure adjustment part comprises a tight adjustment mechanism adapted to be deformed elastically during insertion in the blind holes 146, 148. This tight adjustment mechanism typically comprises a projection and a complementary recess such as for example a boss or a slot in the form of 'eye of the needle' at the centre of the longitudinal axis of the spindle.

Alternatively or in addition the blind holes 146, 148 present elasticity properties. The diameter of the blind holes 146, 148 is slightly smaller than the width of the spindle so that insertion creates friction force. The blind holes 146, 148 typically have a cylindrical form.

To improve insertion and holding of the spindles in the blind holes 146, 148, the blind holes 146, 148 advantageously present a diameter diminishing in a direction oriented from the interior of the circuit board to the surface of the circuit board. The blind holes 146, 148 have a frusto-conical form for example.

Production Process

In reference to FIG. 8, the backplane circuit board 20 can be produced according to a process comprising the following steps. The order of the steps is indicative and can be modified. It is possible for example to have the holes 146', 148' passing through the printed circuits 21, 22 before or after the cleared zones 41, 42 of the bonding layers 31, 32 have been produced, and after or before deposition of these bonding layers 31, 32 on the third printed circuit 23.

In a first step E1 the first printed circuit 21 having a first face 211 and a second face 212 designed to form the internal face 142 of the backplane circuit board 20 are provided, as also a second printed circuit 22 having a first face 221 and a second face 222 designed to form the external face 143 of the backplane circuit board 20 and a third printed circuit 23 having a first face 231 and a second face 232.

A first bonding layer 31 and a second bonding layer 32 are also provided. A bonding layer 31, 32 is constituted by adhesive material, which comprises a support such as a fabric, generally glass, impregnated by a non-polymerised resin, a material currently designated by "pre-preg". The resin is typically of epoxy type, but can also comprise other material such as poly(phenylene oxide) (PPO) or polyphenylene ether (PPE). The rate of non-polymerised resin in the adhesive material is between 60 and 80% for example.

In all cases, the resin has a high dynamic viscosity and therefore low creep. Such a resin is currently qualified by the terms of "no-flow" or "low-flow". In this way, the resin preferably has a dynamic viscosity greater than 5000 poises between 80° C. and 180° C., and preferably greater than 10000 poises below 100° C. A "no-flow" or "low-flow" resin is distinguished therefore by resins called "uniflow" or "standard flow", which generally present dynamic viscosities ten times lower.

The dynamic viscosity can for example be measured with a temperature increasing by 3 to 8° C. per minute to reach the temperature to be tested. This low viscosity prevents rising of resin by creep during assembling of the backplane circuit board 20, but also produces zones cleared of material in the bonding layers 31, 32 even before their deposition on a printed circuit, making these zones cleared of material easier to produce. In fact, once a bonding layer 31, 32 is deposited it is in the form of a film.

In a step E1', it is therefore possible to produce first zones 41 cleared of material in the first bonding layer 31, and second zones 42 cleared of material in the second bonding layer 32. The zones 41, 42 cleared of material are positioned such that their positions correspond to the positions designed for the blind holes 146, 148. The zones 41, 42 cleared of material now lack the matter constituting the bonding layers 31, 32, and therefore form through-holes in these bonding layers 31, 32. The zones 41, 42 cleared of material can be made by piercing with a drill bit or a laser, or by forging.

In a step E1", a series of first through-holes 146' is made in the first printed circuit 21. The first through-holes 146' extend from the first face 211 of the first printed circuit 21 to the second face 212 of the first printed circuit 21. Similarly, a series of second through-holes 148' is made in the second printed circuit 22. The second through-holes 148' extend from the first face 221 of the second printed circuit 22 to the second face 222 of the second printed circuit 22. First through-holes 146' and/or second through-holes 148' present a metallic coating 46, 48 on their walls. The metallic coatings 46, 48 on the walls of the through-holes 146', 148' preferably each present a first flange 461, 481 extending on the first faces 211, 221 of the printed circuits 21, 22. These first flanges 461, 481 form an obstacle to creeping of the adhesive material of the bonding layers 31, 32. The metallic coatings 46, 48 on the walls of the through-holes 146', 148' can also each present a second flange 462, 482 extending on the second faces 212, 222 of the printed circuits 21, 22. The flanges 461, 481, 462, 482 can for example be produced by etching of conductive layers in the printed circuits 21, 22.

In a step E1''', if the conductive pads 35, 36 are planned, they can be produced by previous etching of a conductive layer of the third printed circuit 23. To this effect, the third printed circuit 23 can initially be a dual-face printed circuit, and the copper zones of the conductive layers are preserved during etching to form the conductive pads 35, 36. As pointed out earlier, the conductive pads 35, 36 can present central recesses 37, 38 designed to face the through-holes 146', 148' of the printed circuits 21, 22 designed to form the blind holes 146, 148.

In a step E2, the first bonding layer 31 is deposited on the first face 231 of the third printed circuit 23, and deposited onto the second face 232 of the third printed circuit 23 of the second bonding layer 32. The first bonding layer 31 is arranged on the first face 231 of the third printed circuit 23 such that the first conductive pads 35 are in first zones 41 cleared of material of the first bonding layer 31. Similarly, the second bonding layer 32 is arranged on the second face 232 of the third printed circuit 23 such that the second conductive pads 36 are in second zones 42 cleared of material of the second bonding layer 32. The first flanges 461, 481 of the metallic coatings 46, 48 are also in the zones cleared of material 41, 42 of the bonding layers 31, 32.

In a step E3, the first face 211 of the first printed circuit 21 is applied to the first bonding layer 31. During assembling, each first through-hole 146' of the first printed circuit 21 is aligned with a first zone cleared of material 41 of the first bonding layer 31. In this way, the first printed circuit 21 is arranged such that each first through-hole 146' of the first printed circuit 21 opens in a first zone cleared of material 41 to form the first blind holes 146. Similarly, the first face 221 of the second printed circuit 22 is applied to the second bonding layer 32. During assembling, each second through-hole 148' of the second printed circuit 22 is aligned with a second zone cleared of material 42 of the second bonding layer 32. In this way, the second printed circuit 22 is arranged such that each second through-hole 148' of the second printed circuit 22 opens in a second zone 42 cleared of material to form the second blind holes 148. Preferably, the through-holes 146', 148' and the zones 41, 42 cleared of material have a circular cross-section, and are aligned substantially coaxially during assembling of the printed circuits 21, 22, 23.

It should be noted that the first zone 41 cleared of material in which a first through-hole 146' opens has a diameter greater than the diameter of the first through-hole 146' of at least 100 µm, and preferably at least 250 µm, and even more preferably at least 500 µm. Similarly, a second zone 42 cleared of material in which a second through-hole 148' opens has a diameter greater than the diameter of the second through-hole 148' of at least 100 µm, and preferably at least 250 µm, and even more preferably at least 500 µm. In the presence of a first flange 461, 481, the zones cleared of material 41, 42 present a diameter greater than that of the first flange 461, 481, preferably of at least 100 µm, more preferably at least 250 µm, and even more preferably at least 500 µm. Also, the zones cleared of material 41, 42 and the through-holes 146', 148' preferably present aligned centres such that the zones cleared of material 41, 42 extend on either side of the extension of the through-holes 146', 148' in the plane of the bonding layers 31, 32.

Once the first printed circuit 21 has been placed on the first bonding layer 31 and the second printed circuit 22 has been placed on the second bonding layer 32, the process then comprises pressing of the first printed circuit 21 on the first bonding layer 31 and pressing of the second printed circuit 22 on the second bonding layer 32. This pressing can be accompanied by a reduction in ambient air pressure by air vacuum. During pressing the conductive pads 35, 36 can make contact with the metallic coating on the walls of the through-holes 146', 148".

During assembling, and in particular during the pressing step of the assembling, the resin of the bonding layers 31, 32 flows in the interface plane of the bonding layers 31, 32, and at least partially fills the zones 41, 42 cleared of material of these bonding layers 31, 32. The presence of the zones 41, 42 cleared of material absorbs the creep of the resin, and prevents rising of resin in the through-holes 146', 148' of the printed circuits 21, 22. The choice of high-viscosity resin for the bonding layers 31, 32 limits this creep, and therefore prevents this rising of resin even better. Also, the zones 41, 42 cleared of material prevent the rising of resin all the more since their diameter is greater than the diameter of the through-holes 146', 148' of the printed circuits 21, 22.

The presence of conductive pads 35, 36 forms an obstacle to creep of the adhesive material of the bonding layers 31, 32, such as resin. The resin is then stopped against the conductive pads 35, 36 which face the through-holes 146', 148' of the printed circuits 21, 22, and does not rise in the latter. The conductive pads 35, 36 at least delay creep of the adhesive material of the bonding layers 31, 32. Similarly, the first flanges 461, 481 form an obstacle to creep of the adhesive material of the bonding layers 31, 32, such as resin. This effect is accentuated all the more when the conductive pads 35, 36 make contact with the first flanges 461, 481 of the metallic coatings 46, 48 of the walls of the first through-holes 146' and/or the second through-holes 148' designed to form the blind holes 146, 148. The form of the conductive pads 35, 36 is selected so as to best aid this stopping or this limitation of the creep of the resin. The conductive pads 35, 36 can not only be in the form of a disc or concentric rings, or any other appropriate form.

The first through-holes 146' of the first printed circuit 21, optionally extended by the remainder of the first zones 31 cleared of material after creep of the resin, form the first blind holes 146 of the backplane circuit board 20, whereas the second through-holes 148' of the second printed circuit 22, optionally extended by the remainder of the second zones 32 cleared of material after creep of the resin, form the second blind holes 148 of the backplane circuit board 20.

Finally, the resin of the bonding layers 31, 32 is polymerised to finalise assembling. Typically, to allow polymerisation of the resin of the bonding layers 31, 32, pressing is continued over time as necessary, for example from one to several hours, preferably with heating at a temperature between 120° C. and 200° C., and preferably between 150° C. and 180° C. This temperature is generally attained via a controlled rise in temperature, for example between 3 and 8° C. per minute, and is maintained over several tens of minutes, while pressing is being maintained. Once polymerised, the resin of the bonding layer has dielectric properties similar to the material insulating of the printed circuits 21, 22, 23.

After assembling, the second face 212 of the first printed circuit 21 forms the internal face 142 of the backplane circuit board 20, and the second face 222 of the second printed circuit 22 forms the external face 143 of the backplane circuit board 20.

Once assembling is completed, it is possible to produce the through-holes 147 of the backplane circuit board by piercing, passing through the first printed circuit 21, the first bonding layer 31, the third printed circuit 23, the second bonding layer 32, and the second printed circuit 22. These through-holes 147 are then metallised to enable electrical connection between the first printed circuit 21 and the second printed circuit 22.

To ensure the neatness of the blind holes 146, 148 while the through-holes 147 are being made it is possible to position a plastic closing film closing off the blind holes 146, 148. In this way, a closing film can be placed at the surface of the second face 212 of the first printed circuit 21, or on the second face 222. For later introduction of a contact element in the form of a spindle 131, 151 into the blind holes 146, 148, it is possible to provide micro-slots in the closing film in the region of orifices of blind holes 146, 148. These micro-slots can advantageously be made by laser, and more particularly by means of a laser robot capable of making such cut-outs which are utilised for other applications during production of printed circuits. The micro-slots of the closing film continue to ensure protection for the blind holes 146, 148 and during introduction of contact elements into blind holes 146, 148 allow a clean piercing without consequences on the later quality of the connections between the contact elements and the first and second printed circuits 21, 22.

The invention is not limited to the embodiment described and illustrated in the appended figures. Modifications are still possible, especially from the viewpoint of the constitution of various technical characteristics or by substitution of equivalent techniques, without as such departing from the field of protection of the invention.

The invention claimed is:

1. A process for producing a backplane circuit board having an internal face adapted to be connected to connectors of circuit boards and an external face adapted to be connected to an external connector, a series of first blind holes opening on the internal face of the backplane circuit board and a series of second blind holes opening on the external face of the backplane circuit board, the backplane circuit board comprising:
   a first printed circuit having a first face and a second face designed to form the internal face of the backplane circuit board;
   a second printed circuit having a first face and a second face designed to form the external face of the backplane circuit board and;
   a third printed circuit having a first face facing the first face of the first printed circuit and a second face facing the first face of the second printed circuit, the third printed circuit constituting an electrical insulator between the first face and the second face of the third printed circuit, said first blind holes passing through the first printed circuit but not passing through the third printed circuit and said second blind holes passing through the second printed circuit but not passing through the third printed circuit;

wherein the process comprises the following steps:
depositing on the first face of the third printed circuit of a first bonding layer, said first bonding layer having first zones cleared of material distributed on the first face of the third printed circuit, and depositing on the second face of the third printed circuit of a second bonding layer, said second bonding layer having second zones cleared of material distributed on the second face of the third printed circuit; then,
assembling on the first bonding layer of the first face of the first printed circuit, said first printed circuit having a series of first through-holes designed to form the first blind holes, each first through-hole opening in a first zone cleared of material of the first bonding layer on the first face of the third printed circuit to form the first blind holes, and assembling on the second bonding layer of the first face of the second printed circuit, said second printed circuit having a series of second through-holes designed to form the second blind holes, each second through-hole opening in a second zone cleared of material of the second bonding layer on the second face of the third printed circuit to form the second blind holes,
wherein the third printed circuit comprises first conductive pads distributed on the first face, the first bonding layer being arranged on the first face of the third printed circuit such that the first conductive pads are in first zones cleared of material of the first bonding layer, and after assembling said first conductive pads face first through-holes of the first printed circuit to form the base of the first blind holes of the internal face of the backplane circuit board, and/or the third printed circuit comprises second conductive pads distributed on the second face, the second bonding layer being arranged on the second face of the third printed circuit such that the second conductive pads are in second zones cleared of material of the second bonding layer, and after assembling the second conductive pads face second through-holes of the second printed circuit to form the base of the second blind holes of the external face of the backplane circuit board.

2. The process according to claim 1, wherein each first through-hole has a diameter, and the first zone cleared of material in which said first through-hole opens has a diameter greater than the diameter of the first through-hole of at least 100 µm, and wherein each second through-hole has a diameter, and the second zone cleared of material in which said second through-hole opens has a diameter greater than the diameter of the second through-hole of at least 100 µm.

3. The process according to claim 1, wherein the adhesive material comprises a fabric impregnated with non-polymerised resin.

4. The process according to claim 3, wherein the resin has a dynamic viscosity greater than 5000 poises between 80° C. and 180° C.

5. The process according to claim 1, wherein the first bonding layer has the first zones cleared of material before the deposition of said first bonding layer on the first face of the third printed circuit and/or the second bonding layer has the second zones cleared of material before the deposition of said second bonding layer on the second face of the third printed circuit.

6. The process according to claim 1, wherein the conductive pads have a central recess opposite the through-holes of the first printed circuit and/or of the second printed circuit designed to form the blind holes.

7. The process according to claim 6, wherein the central recess extends over the entire depth of the respective conductive pad.

8. The process according to claim 6, wherein the central recesses are made by piercing the conductive pads.

9. The process according to claim 6, wherein the central recesses are made during a step for etching of the third printed circuit to form the conductive pads.

10. The process according to claim 1, wherein the conductive pads result from previous etching of a conductive layer of the third printed circuit.

11. The process according to claim 1, wherein first through-holes and/or second through-holes designed to form the blind holes have a metallic coating of their walls having a first flange extending on the first faces of the first and second printed circuits.

12. The process according to claim 1, wherein assembling on the first bonding layer of the first face of the first printed circuit comprises placing of the first face of the first printed circuit on the first bonding layer with the first through-holes designed to form the blind holes facing first zones cleared of material, and pressing of the first printed circuit on the first bonding layer with heating at a temperature between 140 and 200° C., and/or assembling on the second bonding layer of the first face of the second printed circuit comprises placing of the first face of the second printed circuit on the second bonding layer with the second through-holes designed to form the blind holes facing second zones cleared of material, and pressing of the second printed circuit on the second bonding layer with heating at a temperature between 140 and 200° C.

* * * * *